(12) United States Patent
Florian et al.

(10) Patent No.: US 7,868,524 B2
(45) Date of Patent: Jan. 11, 2011

(54) PIEZOELECTRIC COMPONENT

(75) Inventors: Heinz Florian, Bad Gams (AT); Igor Kartashev, Deutschlandsberg (AT); Klaus Reichmann, Graz (AT); Wolfgang Vogl, Vienna (AT)

(73) Assignee: EPCOS AG, Munich (DE)

( * ) Notice: Subject to any disclaimer, the term of this patent is extended or adjusted under 35 U.S.C. 154(b) by 158 days.

(21) Appl. No.: 11/814,441

(22) PCT Filed: Jan. 25, 2006

(86) PCT No.: PCT/DE2006/000114
§ 371 (c)(1), (2), (4) Date: Jan. 12, 2009

(87) PCT Pub. No.: WO2006/079324
PCT Pub. Date: Aug. 3, 2006

(65) Prior Publication Data
US 2009/0243441 A1    Oct. 1, 2009

(30) Foreign Application Priority Data
Jan. 26, 2005 (DE) .................. 10 2005 003 693
Apr. 13, 2005 (DE) .................. 10 2005 017 108

(51) Int. Cl.
*H01L 41/083* (2006.01)

(52) U.S. Cl. ..................................... 310/366

(58) Field of Classification Search .................. 310/366
See application file for complete search history.

(56) References Cited

U.S. PATENT DOCUMENTS

| | | | |
|---|---|---|---|
| 4,019,073 A | 4/1977 | Vishnevsky et al. | |
| 4,400,641 A | 8/1983 | Vishnevsky et al. | |
| 4,453,103 A | 6/1984 | Vishnevsky et al. | |
| 4,819,128 A | 4/1989 | Florian et al. | |
| 6,208,026 B1 * | 3/2001 | Bindig et al. | 257/718 |
| 6,333,589 B1 | 12/2001 | Inoi et al. | |
| 6,914,392 B2 | 7/2005 | Hanisch et al. | |
| 7,208,862 B2 | 4/2007 | Florian et al. | |
| 7,304,414 B2 | 12/2007 | Florian et al. | |
| 7,343,137 B2 | 3/2008 | Block et al. | |
| 7,408,292 B2 | 8/2008 | Feltz et al. | |
| 7,411,340 B2 | 8/2008 | Florian et al. | |
| 7,432,639 B2 | 10/2008 | Florian et al. | |

(Continued)

FOREIGN PATENT DOCUMENTS

DE    103 20 161    3/2004

(Continued)

OTHER PUBLICATIONS

English Translation of EP Search Report in Application No. 06 705 850.3, dated Sep. 17, 2009.

(Continued)

*Primary Examiner*—Thomas M Dougherty
(74) *Attorney, Agent, or Firm*—Fish & Richardson P.C.

(57) ABSTRACT

A multiple-layer component includes at least two metal layers, at least one dielectric layer among the at least two metal layers, and a contact element that includes a porous body that electrically connects the at least two metal layers. The at least one dielectric layer includes dielectric layers made from ceramic material that are sintered.

25 Claims, 3 Drawing Sheets

U.S. PATENT DOCUMENTS

| | | |
|---|---|---|
| 7,477,002 B2 | 1/2009 | Florian |
| 7,492,565 B2 | 2/2009 | Block et al. |
| 7,525,241 B2 | 4/2009 | Florian et al. |
| 7,579,756 B2 | 8/2009 | Althoff et al. |
| 7,692,368 B2 | 4/2010 | Florian et al. |
| 7,723,897 B2 | 5/2010 | Florian et al. |
| 7,723,902 B2 | 5/2010 | Florian et al. |
| 2002/0098333 A1 | 7/2002 | Feltz et al. |
| 2002/0121845 A1 | 9/2002 | Gueldner et al. |
| 2003/0008536 A1 | 1/2003 | Whelan |
| 2004/0051423 A1 | 3/2004 | Florian et al. |
| 2004/0257740 A1 | 12/2004 | Block et al. |
| 2004/0264095 A1 | 12/2004 | Block et al. |
| 2005/0035686 A1 | 2/2005 | Florian et al. |
| 2005/0059358 A1 | 3/2005 | Block et al. |
| 2005/0059371 A1 | 3/2005 | Block et al. |
| 2005/0236933 A1 | 10/2005 | Florian et al. |
| 2006/0119228 A1 | 6/2006 | Florian et al. |
| 2006/0251911 A1 | 11/2006 | Feltz et al. |
| 2007/0158608 A1 | 7/2007 | Feltz et al. |
| 2007/0176521 A1* | 8/2007 | Nakamura ............... 310/366 |
| 2007/0194667 A1 | 8/2007 | Florian et al. |
| 2007/0267948 A1 | 11/2007 | Feltz et al. |
| 2007/0278906 A1 | 12/2007 | Florian et al. |
| 2008/0030105 A1 | 2/2008 | Florian et al. |
| 2008/0042522 A1 | 2/2008 | Althoff et al. |
| 2008/0057798 A1 | 3/2008 | Florian et al. |
| 2008/0224570 A1 | 9/2008 | Florian et al. |
| 2008/0224572 A1* | 9/2008 | Dollgast et al. ............ 310/366 |
| 2009/0134747 A1 | 5/2009 | Reichmann et al. |
| 2009/0146534 A1 | 6/2009 | Reichmann et al. |
| 2009/0193636 A1 | 8/2009 | Florian et al. |
| 2009/0218916 A1 | 9/2009 | Florian et al. |
| 2009/0243441 A1 | 10/2009 | Florian et al. |
| 2009/0278422 A1 | 11/2009 | Florian et al. |
| 2009/0278424 A1 | 11/2009 | Florian et al. |
| 2010/0193107 A1 | 8/2010 | Florian et al. |

FOREIGN PATENT DOCUMENTS

| | | |
|---|---|---|
| DE | 102004005528 | 8/2004 |
| DE | 102004015574 | 11/2004 |
| EP | 0844678 | 5/1998 |
| EP | 1 257 006 | 11/2002 |
| EP | 1329915 | 7/2003 |
| JP | 2000-077733 * | 3/2000 |
| JP | 2004 241590 | 8/2004 |
| JP | 2004-241590 * | 8/2004 |
| JP | 2004 319967 | 11/2004 |
| JP | 2005-072325 * | 3/2005 |
| WO | WO03/094252 | 11/2003 |
| WO | WO2005/104256 | 11/2005 |

OTHER PUBLICATIONS

English Translation of International Preliminary Report on Patentability in Application No. PCT/DE2006/000114, dated Jul. 31, 2007.
English translation of Written Opinion for PCT/DE2006/000114.
International Search Report for PCT/DE2006/000114.
Written Opinion for PCT/DE2006/000114.

* cited by examiner

PIEZOELECTRIC COMPONENT

TECHNICAL FIELD

This patent application described a piezoelectric multiple-layer component.

BACKGROUND

WO 03/094252 A2 describes a piezoelectric actuator that contains piezoelectric layers and internal electrodes arranged among the piezoelectric layers in a multiple-layer construction.

SUMMARY

Described herein is a piezoelectric multiple-layer component that may withstand high mechanical and electrical loading.

A piezoelectric multiple-layer component can be constructed, for example, as a piezoceramic component with a ceramic base body, structured metal layers arranged therein, and external contacts. Electromechanical deformations of the body can take place, which lead to mechanical stress between the ceramic layers and metal layers and which can lead to the formation of cracks in metal structures accompanied with breaks in the contacts all the way up to detachment of the metallization.

A multiple-layer component is described with at least two metal layers, which are separated from each other by a dielectric layer and which are connected to each other electrically by a contact element comprising a porous body.

A porous material is suited for damping mechanical vibrations. In a porous body, the propagation of acoustic waves is largely stopped.

The porosity of the body can equal, e.g., more than 10%, in an advantageous way more than 20%. The porosity of a body is understood to be the ratio of the volume of the existing hollow spaces to the total volume of the body.

The pore size is determined, e.g., by the grain size of a material, which is used for producing the porous body, and can be, for example, between 0.1 to 100 μm, in one embodiment mainly between 0.1 and 10 μm.

A piezoelectric component is described, with a base body, which comprises a stack of piezoelectric layers lying one above the other and electrode layers lying in-between. In each electrode layer, there is at least one internal electrode. A contact-forming, electrically conductive contact element, which comprises a porous material, runs perpendicular to the internal electrodes.

The piezoelectric multiple-layer component may be a piezoceramic piezoelectric actuator or piezoelectric transformer.

The multiple-layer component is distinguished by high reliability and cycle stability because formation of cracks in the porous material of the contact element is suppressed. If a crack appears, it meets a pore and is stopped. In addition, over time, mechanical stress at the boundary between the ceramic and the metallization is effectively broken down through the formation of many small cracks, without negatively affecting the electrical connection.

The piezoelectric layers may comprise ceramic material and are sintered with each other and with the electrode layers. First and second internal electrodes may be provided one above the other in an alternating sequence. The first internal electrodes each form a contact with a first contact element and are isolated from a second contact element. Conversely, the second internal electrodes each form a contact with the second contact element and are isolated from the first contact element.

In an embodiment, the contact element is constructed as a pin. The pin can be made from a porous material. Alternatively, the pin can have a porous body on which an electrically conductive layer is deposited. The electrically conductive layer can be deposited onto the porous body, e.g., in the form of a bonding agent-containing and, e.g., silver-containing and/or copper-containing metal paste. In this embodiment, the pin is pushed into a recess or opening provided for the pin in the component base body and sintered together with the piezoelectric layers and electrode layers. During sintering, the metal paste is burned into the base body producing a tight connection between the pin and the base body.

In one embodiment, the porous body can be electrically conductive, e.g., it is provided as a metal sponge. In another embodiment, an electrically conductive porous material can be organic.

In an embodiment, a solid pin made from an electrically conductive material, such as a metal, is in the porous body.

Several porous bodies arranged one above the other and separated from each other by an air gap can be fixed on the solid pin. The material of the porous body may be electrically conductive.

A contact cap made from an electrically conductive material can be provided on one end of the porous body of the contact element. In one embodiment, the electrically conductive material of the contact cap can be soldered. The contact cap can comprise solder or can be covered with a solder layer. The contact cap can be formed from a metal film, which covers the end of the pin-like contact element or the end of the porous body.

It is possible to insert the contact element only partially into the base body. In this case, a recess for receiving the contact element is formed on one side of the base body.

A part of the contact element may engage with a positive fit in this recess and is fixed in this recess, e.g., by a bonding agent. The bonding agent may be an electrically conductive layer. The bonding agent can comprise organic components.

In another construction, it is possible to arrange the contact element for the most part in the interior of the base body, wherein the jacket surface of the contact element may be surrounded on all sides by the base body in cross section perpendicular to the alignment of the contact element. In the interior of the base body, there is an opening for receiving the contact element.

The porous material can have an open-pore construction, i.e., most of its pores can be connected to each other.

The porous body can be made from an inorganic material, which is not electrically conductive in one variant, e.g., ceramic, whose surface is provided with an electrically conductive layer. The electrically conductive layer may be a metal layer.

In another embodiment, the electrically conductive porous material can be formed from an organic material whose surface is provided with an electrically conductive layer, e.g., made from metal.

The contact element may be oriented parallel to the piezoelectric axis. It is advantageous to arrange the contact element at a position of the base body, where the smallest mechanical stresses occur. This can be, for example, the middle region of the base body. Therefore, in one embodiment, the contact element can be arranged in the center in the interior of the base body.

The contact element arranged in the center in the interior of the base body can have a metal pin and several segments, which are made from a conductive, porous material and which are fixed to this pin and electrically connected to the metal pin. These segments may be arranged at a distance from each other in the axial direction. In one embodiment, it is also possible to fix several segments, which are spaced apart from each other in the peripheral direction and which are made from a porous material, on a pin.

In a first embodiment, the contact element can be pushed into the layer stack before decarburization and before sintering. Then it is advantageous to adjust the dimensions of the hole to the dimensions of the contact element, so that after the sintering of the layer stack, the layers are shrunk onto the contact element to a certain extent due to the shrinkage of the ceramic contained in the piezoelectric layers and thus an electrical contact between the contact element and the electrode layers can be formed.

Furthermore, it is advantageous when the contact element has up to at least 50% at least on its surface of the same material from which the electrode layers are formed. This guarantees a relatively good chemical connection of the contact element to the electrode layers, which improves the electrical contact between the contact element and electrode layers.

Through suitable dimensions of the hole and contact element as well as shrinking the ceramic material onto the contact element, a positive-fit or non-positive-fit connection between the contact element and the body can be established. A positive-fit connection is advantageous for the production of the electrical contact between the contact element and the electrode layers.

In another embodiment, the contact element or the formation of the hole can be realized after the decarburization and sintering of the layer stack. In this case, if the contact element is to be used, in turn, for forming a contact for the electrode layers, it is advantageous if the dimensions of the hole and the contact element are adjusted to each other, so that in the sintered state of the layer stack, the contact element can still be pushed through the hole; that is, a certain minimum play exists between the inner wall of the layer stack and the outer wall of the contact element. To produce a reliable contact, it is then advantageous to provide, for example, the contact element on its outer side with graphite or another electrically conductive lubricant, which allows the intermediate spaces necessary for pushing in the contact element to be filled and which ensures a good contact between the contact element and the electrode layer.

Below, embodiments are described with reference to corresponding figures. The figures show different embodiments and are not to scale. Parts that are identical or that have identical functions are designated with the same reference symbols.

DETAILED DESCRIPTION

Figure 1A:
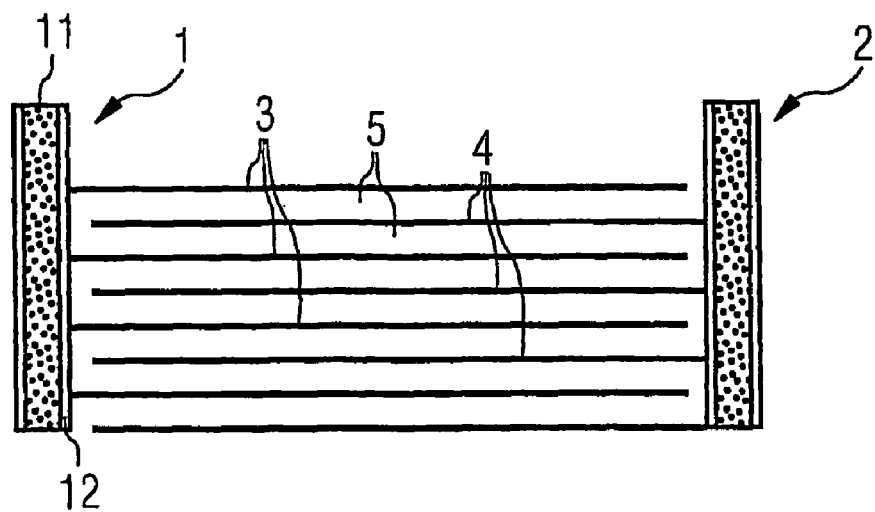
FIG. 1A, a piezoelectric multiple-layer component with contact elements made from a porous material partially countersunk in the base body.

In a cut out, FIG. 1A shows a schematic cross section of a piezoelectric multiple-layer component. The component has electrode layers arranged one above the other with first internal electrodes 3 and second internal electrodes 4 structured in these layers.

Dielectric layers 5, such as ceramic layers, are arranged between the electrode layers. The internal electrodes 3, 4 form contacts alternately with contact elements 1, 2. The associated internal electrodes—first electrode layers 3 or second electrode layers 4—are connected to each other electrically by the contact elements 1 or 2 insulated from the corresponding other internal electrodes. The contact elements 1, 2 extend transverse to the main surfaces of the internal electrodes.

The contact elements 1, 2 each comprise a porous body 11. An electrically conductive layer 12 is deposited onto the surface or jacket surface of the porous body 11.

Figure 1B:
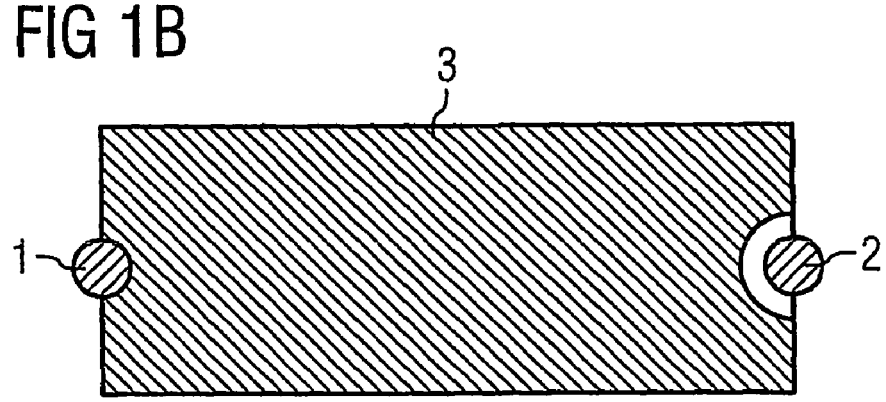
FIG. 1B, a top view onto a metal layer of the component according to FIG. 1A.

In FIG. 1B, a structured electrode layer is shown with a first internal electrode 3 constructed in this layer. The first internal electrode 3 is connected at the left to the first contact element 1 and has on the right a recess, by which it is electrically isolated from the second contact element 2.

Figure 1C:
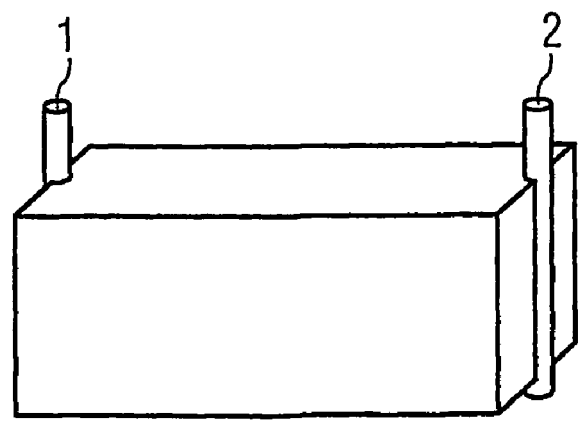
FIG. 1C, a perspective view of the component according to FIG. 1A.

The component according to FIG. 1A is shown in a perspective view from the side in FIG. 1C. A recess extending in the axial direction is constructed in the form of a groove on two opposite outer sides of the base body.

The contact elements 1, 2 with a porous body may be preformed before the sintering of the base body. The jacket surface of the porous body and/or the surface of the provided recess is covered with a bonding layer, e.g., a metal paste, and the contact element is placed in the recess. The base body is then sintered together with the contact element.

In the embodiment shown in FIGS. 1A to 1C, the contact element is surrounded in cross section only partially by the base body.

Figure 2A:
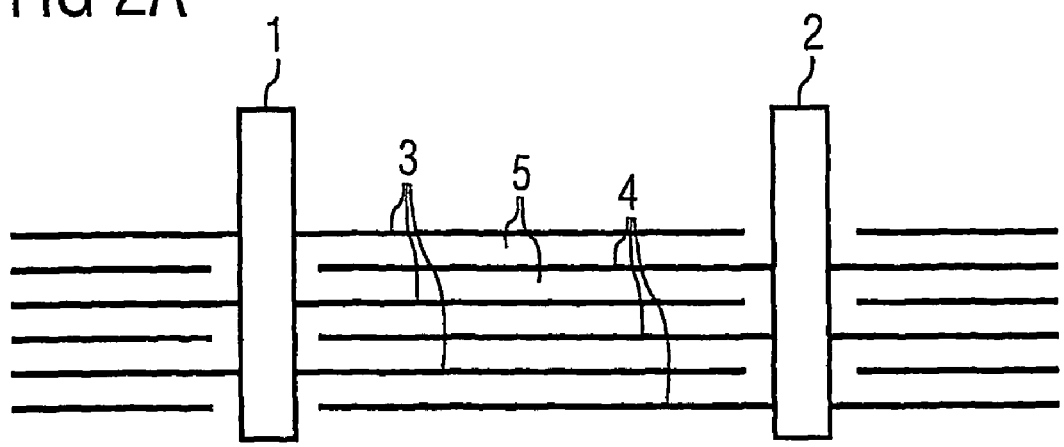
FIG. 2A, a piezoelectric multiple-layer component with contact elements made from a porous material arranged in the base body.
Figure 2B:
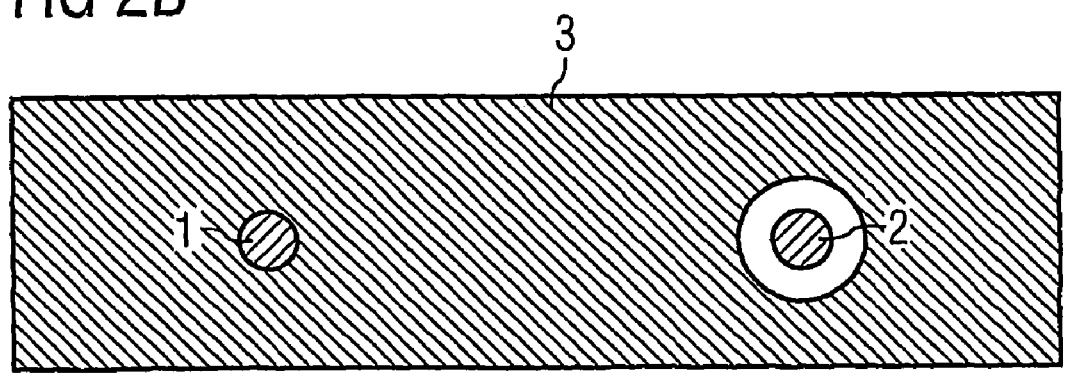
FIG. 2B, a top view onto a metal layer of the component according to FIG. 2A.
Figure 2C:
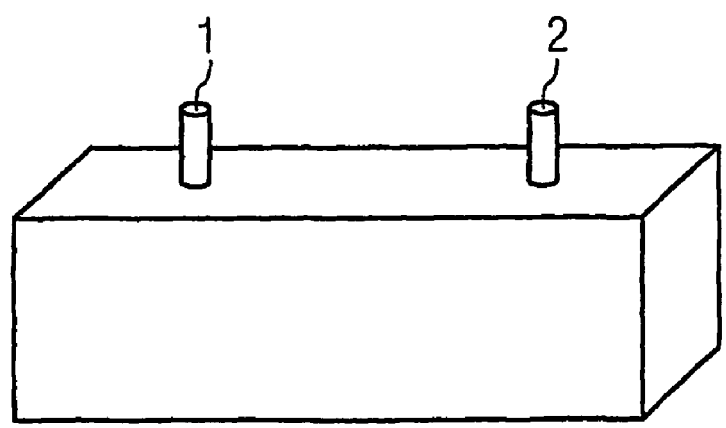
FIG. 2C, a perspective view of the component according to FIG. 2A.

In the embodiment of a piezoelectric multiple-layer component shown in FIGS. 2A-2C, the contact elements 1, 2 are each arranged in the body, so that the contact element is surrounded in cross section by the base body on all sides.

In the base body, an opening, in which the contact element preformed in the shape of a pin is pushed, is constructed transverse to the electrode layers.

In FIGS. 3A, 3B, 4, and 5, different embodiments of a contact element are shown. However, there are also other possibilities for constructing a contact element, which comprises a porous body.

Figure 3A:
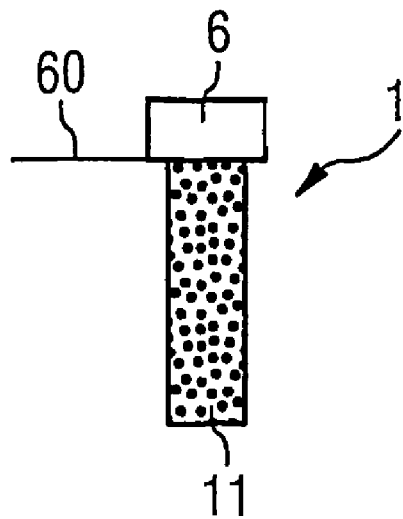
FIG. 3A, in cross section a contact element made from a porous material.

In FIG. 3A, a contact element 1 is shown with a porous body 10. In this embodiment, the contact element 1 comprises a porous body.

The porous body 10 may be cylindrical, but can be a porous pin with an arbitrary cross section.

An electrically conductive cap 6, which is used to make another contact between the component and, e.g., a supply line 60, is placed over one end of the porous body 10. The supply line 60 is, for example, an electrical wire.

Figure 3B:
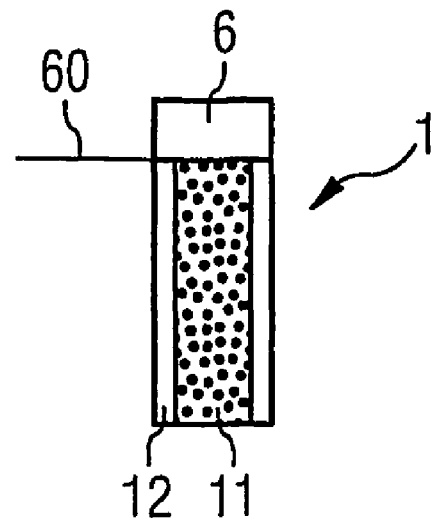
FIG. 3B, in cross section a contact element with a porous body and an electrically conductive layer.

In FIG. 3B, a contact element 1 is shown with a porous body 11 according to FIG. 3A, whose jacket surface is covered by an electrically conductive layer 12.

Figure 4:
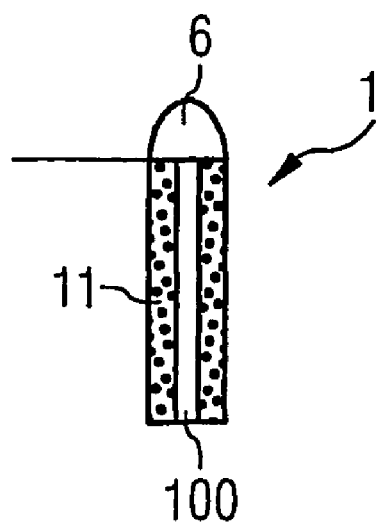
FIG. 4, in cross section a contact element with a porous body and a pin arranged in this body.

In FIG. 4, a contact element 1 is shown with a porous body 11, in which an, e.g., electrically conductive pin 100 extends. In this embodiment, the pin 100 may be a solid carrier pin, which carries the porous body 11.

Figure 5:
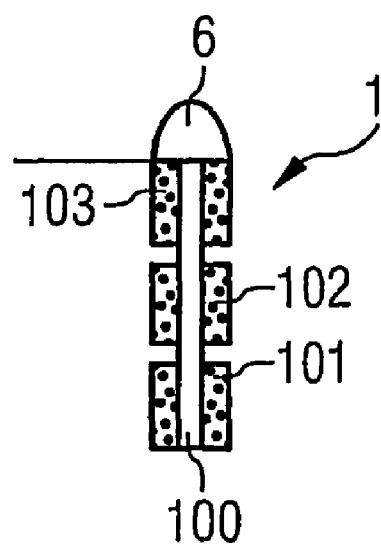
FIG. 5, in cross section a contact element with several porous bodies that are fixed to a pin.

FIG. 5 shows a variant of the embodiment shown in FIG. 4. Here, several porous bodies 101, 102, 103 are fixed on the pin 100 at a distance from each other.

The pin 100 may be, but is not necessarily, made from metal. Any sufficiently stable, electrically conductive material can be used.

A solid pin can be replaced in FIGS. 4, 5 by a metal tube.

The claims are not limited to the embodiments described herein. For producing a porous body of the contact element and also the dielectric layers of the base body of the component, any suitable materials can be used.

The porous body of the contact element can be preformed, but this is not a requirement. For example, there is the possibility of filling an opening provided for a vertical electrical connection in a dielectric layer with a filler, which comprises, in addition to electrically conductive particles, also other substances that form gases during sintering, which leads to the formation of pores in the filler.

All metals or metal alloys that are stable under sintering conditions are suitable as the electrode layers. In particular, electrode layers made from copper or from a mixture of silver and palladium in a weight ratio between 90/10 and 70/30 can be used.

The invention claimed is:

1. A multiple-layer component comprising:
   at least two metal layers;
   at least one dielectric layer among the at least two metal layers; and
   a contact element comprising a porous body, the contact element electrically connecting the at least two metal layers, wherein the contact element is pin-shaped.

2. The component of claim 1, wherein a porosity of the porous body comprises more than 10% of a volume of the porous body.

3. The component of claim 1, wherein the at least one dielectric layer comprises dielectric layers stacked vertically;
   wherein the at least two metal layers comprise internal electrodes among the dielectric layers, the dielectric layers and the internal electrodes forming a base body; and
   wherein the contact element comprises a first contact element and the component further comprises a second contact element, the first contact element and the second contact element extending transversely relative to the internal electrodes, the first contact element and the second contact element each contacting at least one internal electrode.

4. The component of claim 1, wherein each dielectric layer has piezoelectric properties.

5. The component of claim 1 wherein the at least one dielectric layer comprises dielectric layers comprised of ceramic material that are sintered.

6. The component of claim 3, wherein the internal electrodes comprise first internal electrodes and second internal electrodes stacked in alternating sequence;
   wherein the first internal electrodes electrically connect to the first contact element and are electrically insulated from the second contact element; and
   wherein the second internal electrodes electrically connect to the second contact element and are electrically insulated from the first contact element.

7. The component of claim 1 wherein the contact element comprises an electrically conductive layer on the porous body.

8. The component of claim 7, wherein the electrically conductive layer comprises metallic burn-in paste.

9. The component of claim 1, wherein the contact element comprises a pin comprised of electrically conductive material in the porous body.

10. The component of claim 9, wherein the porous body comprises several porous bodies arranged vertically on the pin and separated by one or more air gaps.

11. The component of claim 1, wherein the contact element comprises a contact cap comprised of an electrically conductive material, the contact cap being at an end of the porous body.

12. The component of claim 11, wherein the electrically conductive material is solderable.

13. A multiple-layer component comprising:
    at least two metal layers;
    at least one dielectric layer among the at least two metal layers; and
    a contact element comprising a porous body that electrically connects the at least two metal layers;
    wherein the at least one dielectric layer comprises dielectric layers stacked vertically;
    wherein the at least two metal layers comprise internal electrodes among the dielectric layers, the dielectric layers and the internal electrodes forming a base body;
    wherein the contact element comprises a first contact element and the component further comprises a second contact element, the first contact element and the second contact element extending transversely relative to the internal electrodes, the first contact element and the second contact element each contacting at least one internal electrode; and
    wherein the base body comprises a recess for receiving one of the first and second contact elements, the recess being on a side of the base body.

14. A multiple-layer component comprising:
    at least two metal layers;
    at least one dielectric layer among the at least two metal layers; and
    a contact element comprising a porous body that electrically connects the at least two metal layers;
    wherein the at least one dielectric layer comprises dielectric layers stacked vertically;
    wherein the at least two metal layers comprise internal electrodes among the dielectric layers, the dielectric layers and the internal electrodes forming a base body;
    wherein the contact element comprises a first contact element and the component further comprises a second contact element, the first contact element and the second contact element extending transversely relative to the internal electrodes, the first contact element and the second contact element each contacting at least one internal electrode; and
    wherein an interior of the base body comprises an opening for receiving the one of the first and second contact elements.

15. The component of claim 1, wherein a material comprising the porous body has an open-pore construction.

16. The component of claim 1, wherein a material comprising the porous body is electrically conductive.

17. The component of claim 16, wherein a material comprising the porous body comprises a metal sponge.

18. The component of claim 1, wherein a material comprising the porous body comprises inorganic material.

19. The component of claim 1, wherein a material comprising the porous body is not electrically conductive, and wherein a surface of the porous body comprises an electrically conductive layer.

20. The component of claim 19, wherein the material comprising the porous body comprises ceramic.

21. The component of claim 1, wherein a material comprising the porous body comprises organic material.

22. The component of claim 21, wherein a surface of the porous body comprises an electrically conductive layer.

23. A multiple-layer component comprising:
at least two metal layers;
at least one dielectric layer among the at least two metal layers;
a contact element comprising a porous body that electrically connects the at least two metal layers;
wherein the contact element is in a center region of an interior of a base body comprised of the at least two metal layers and the at least one dielectric layer.

24. The component of claim 21, wherein the contact element comprises:
a metal pin; and
segments comprised of a conductive porous material connected electrically to the metal pin.

25. The component of claim 1, wherein the porous body is transverse to the at least two metal layers.

* * * * *